United States Patent
Wong et al.

(10) Patent No.: US 7,417,462 B1
(45) Date of Patent: Aug. 26, 2008

(54) VARIABLE EXTERNAL INTERFACE CIRCUITRY ON PROGRAMMABLE LOGIC DEVICE INTEGRATED CIRCUITS

(75) Inventors: Wilson Wong, San Francisco, CA (US); Sergey Shumarayev, Los Altos Hills, CA (US); Thungoc M. Tran, San Jose, CA (US); Tim Tri Hoang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/726,174

(22) Filed: Mar. 20, 2007

(51) Int. Cl.
*H03K 19/0175* (2006.01)
*H03K 5/00* (2006.01)
*G06F 7/38* (2006.01)

(52) U.S. Cl. .................. 326/82; 326/37; 327/93; 333/81 R

(58) Field of Classification Search .......... 327/308, 327/309; 333/81 R
See application file for complete search history.

(56) References Cited

U.S. PATENT DOCUMENTS

| | | | | |
|---|---|---|---|---|
| 5,825,571 A | * | 10/1998 | Sandusky et al. | 360/67 |
| 6,147,522 A | * | 11/2000 | Rhode et al. | 327/93 |
| 7,088,147 B2 | * | 8/2006 | Prasad et al. | 327/91 |
| 7,280,005 B2 | * | 10/2007 | Bailey et al. | 333/81 R |
| 2003/0214423 A1 | * | 11/2003 | Lee et al. | 341/118 |
| 2004/0169532 A1 | * | 9/2004 | Kim | 327/113 |

OTHER PUBLICATIONS

"Choosing AC-Coupling Capacitors," Application Note HFAN-1.1, Rev. 0; Sep. 2000, Maxim Integrated Products, Sep. 28, 2000, three pages.

* cited by examiner

*Primary Examiner*—Rexford Barnie
*Assistant Examiner*—Dylan White
(74) *Attorney, Agent, or Firm*—Ropes & Gray LLP; Robert R. Jackson

(57) ABSTRACT

A programmable logic device ("PLD") includes circuitry for optionally and variably modifying characteristics of an input signal in any of several respects. Examples of such modifications include AC coupling the signal into the PLD, low pass filtering the signal (with selectable low-pass filter corner frequency), shifting the common voltage of the input signal, and/or subjecting the input signal to a selectable amount of attenuation.

22 Claims, 2 Drawing Sheets

VARIABLE EXTERNAL INTERFACE CIRCUITRY ON PROGRAMMABLE LOGIC DEVICE INTEGRATED CIRCUITS

BACKGROUND OF THE INVENTION

This invention relates to programmable logic device integrated circuits ("PLDs"), and more particularly to circuitry on PLDs that is variable to facilitate connecting the PLD to various external signal sources.

PLDs are typically intended to be relatively general-purpose devices. The market for a PLD product tends to be larger if the number of different applications in which that product can be successfully employed is greater. A PLD typically interacts with other devices in a system. The wider the range of different signals the PLD can successfully accept from such other system components, the greater the range of possible uses of the PLD, and therefore the greater the potential market for the PLD. By "different signals" in the preceding sentence, it is meant that these different signals have different characteristics or specifications. Examples of such different characteristics are (1) a difference in ground voltage level between the signal source and the PLD, or (2) a difference in common mode voltage level between the signal source and the PLD. Such signals may be data signals (e.g., high-speed serial data signals) or clock signals. High-performance analog receiver or clock buffers on a PLD tend to be optimized to work for a small range of common mode voltages. This range may be limited due to concerns about oxide overstress or keeping transistors in the proper operating range. Again, because a PLD should preferably meet the needs of a wide-range customer base, it would be desirable to be able to either move the commode mode of the incoming signal at a point prior to the PLD's analog receiver or clock buffer, or to limit that incoming signal's output swing to not overstress the receiver or buffer. Among other possible features, the present invention may allow the PLD to change the corner frequency of input signal interface circuitry, for example, in a programmable manner (e.g., using programmable configuration random access memory ("CRAM") bits on the PLD), or in a dynamic manner. This can help the PLD support different applications where the frequency of interest (i.e., of a received signal) is different.

SUMMARY OF THE INVENTION

In accordance with certain aspects of the invention, a programmable logic device ("PLD") may include an input signal node, input buffer circuitry, a circuit path connected between the input signal node and the input buffer circuitry, selectively usable AC coupling circuitry in the circuit path, a selectively usable resistance connection between the circuit path and a reference voltage source, and a selectively usable attenuation circuit connected to the circuit path.

The device may include one or more sources of control signals for controlling whether or not the various selectively usable circuit structures are used in a particular application of the device. The operational characteristics (e.g., the resistance or attenuation) of some of the selectively usable circuit structures may be variable, and control signals may be provided for controlling those characteristics. The various controls (control signals) may be programmable or dynamic. The circuitry may be single-ended or differential.

Further features of the invention, its nature and various advantages will be more apparent from the accompanying drawings and the following detailed description.

DETAILED DESCRIPTION

Figure 1:
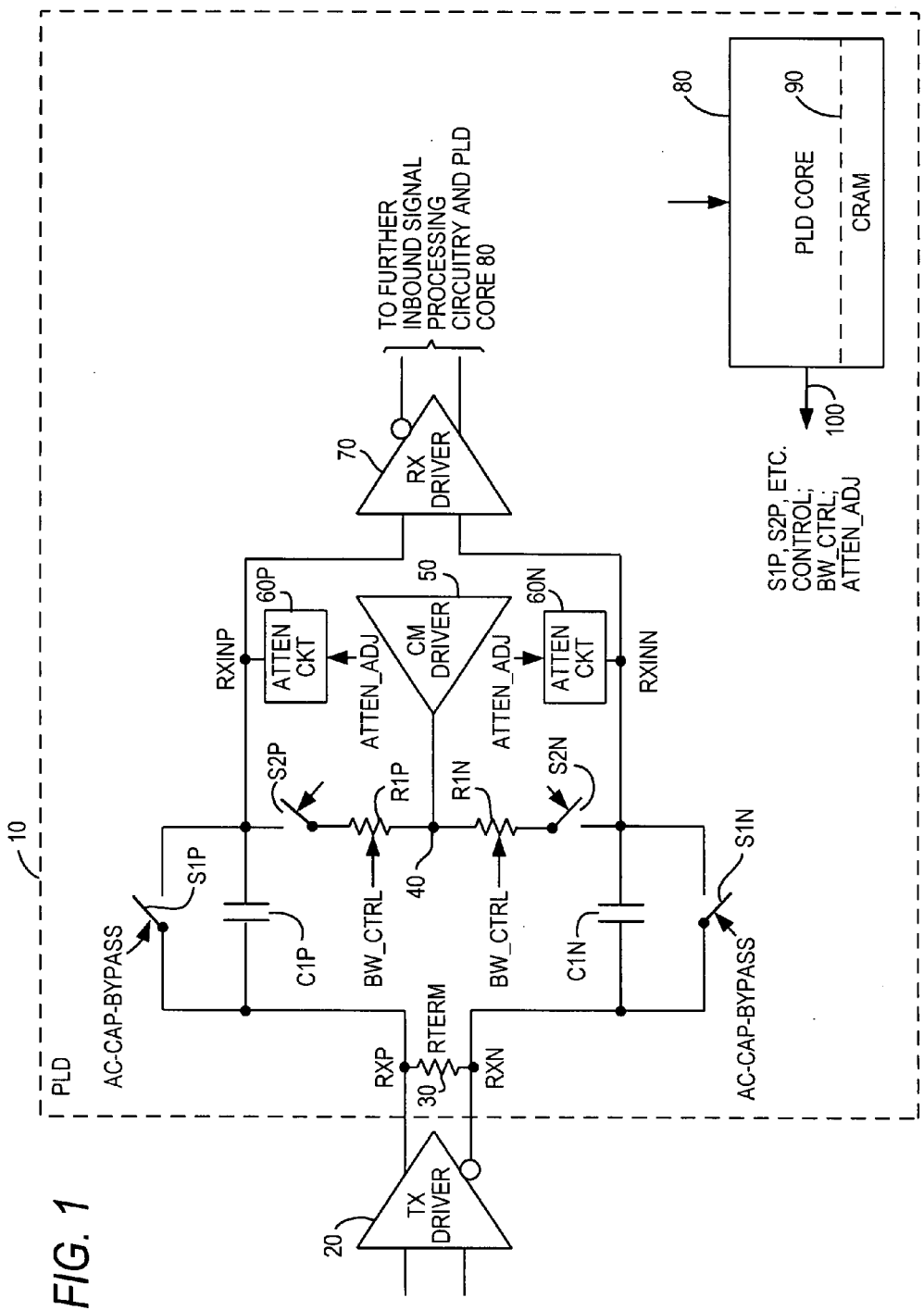
FIG. 1 is a simplified schematic block diagram of an illustrative embodiment of circuitry in accordance with the invention.

An illustrative embodiment of circuitry in accordance with the invention is shown in FIG. 1. This FIG. shows a PLD 10 in accordance with the invention receiving a signal from an external source (i.e., TX driver 20). In the particular example shown in FIG. 1, the signal from TX driver 20 is typically a high-speed serial data signal supplied in differential form, but the invention is equally applicable to single-ended implementations and to differential clock input implementations. The invention uses signals from elsewhere on PLD 10 (e.g., configuration random access memory ("CRAM") or dynamic signals) to control the operation of the AC coupling capacitors, as well as the attenuation of the input signal to the PLD.

As shown in FIG. 1, the differential input signal to PLD 10 is connected across termination resistor 30. End node RXP of resistor 30 is connected to switch S1P and to AC coupling capacitor C1P. The other end node RXN of resistor 30 is connected to switch S1N and to AC coupling capacitor C1N. Elements S1P and C1P are connected in parallel with one another. Elements S1N and C1N are similarly connected in parallel with one another. If switches S1P and S1N are closed, AC coupling capacitors C1P and C1N are bypassed and therefore effectively removed from the circuit. If switches S1P and S1N are open, AC coupling capacitors are in use providing AC coupling between nodes RXP/RXN and the downstream circuitry. The manner in which switches S1P and S1N are controlled has been mentioned above (i.e., the signals for controlling these switches typically come from other circuitry on the PLD). This aspect will be discussed in more detail later in this specification.

Downstream from elements S1P and C1P is node RXINP. Downstream from elements S1N and C1N is node RXINN. The following elements are connected in series between nodes RXINP and RXINN: switch S2P, variable resistor R1P, node 40, variable resistor R1N, and switch S2N. Node 40 is connected to the output of common mode driver 50. Switches S2P and S2N can either be open or closed, as determined by control signals of the same general kind and origin as the control signals that control the open or closed state of switches S1p and S1N. The value of each of resistors R1P and R1N is controlled by the BW_Ctrl (bandwidth control) signals applied to that resistor. Again, these control signals may be of the same general kind and source as the signals that control switches S1p, S1N, S2P, and S2N.

Figure 2:
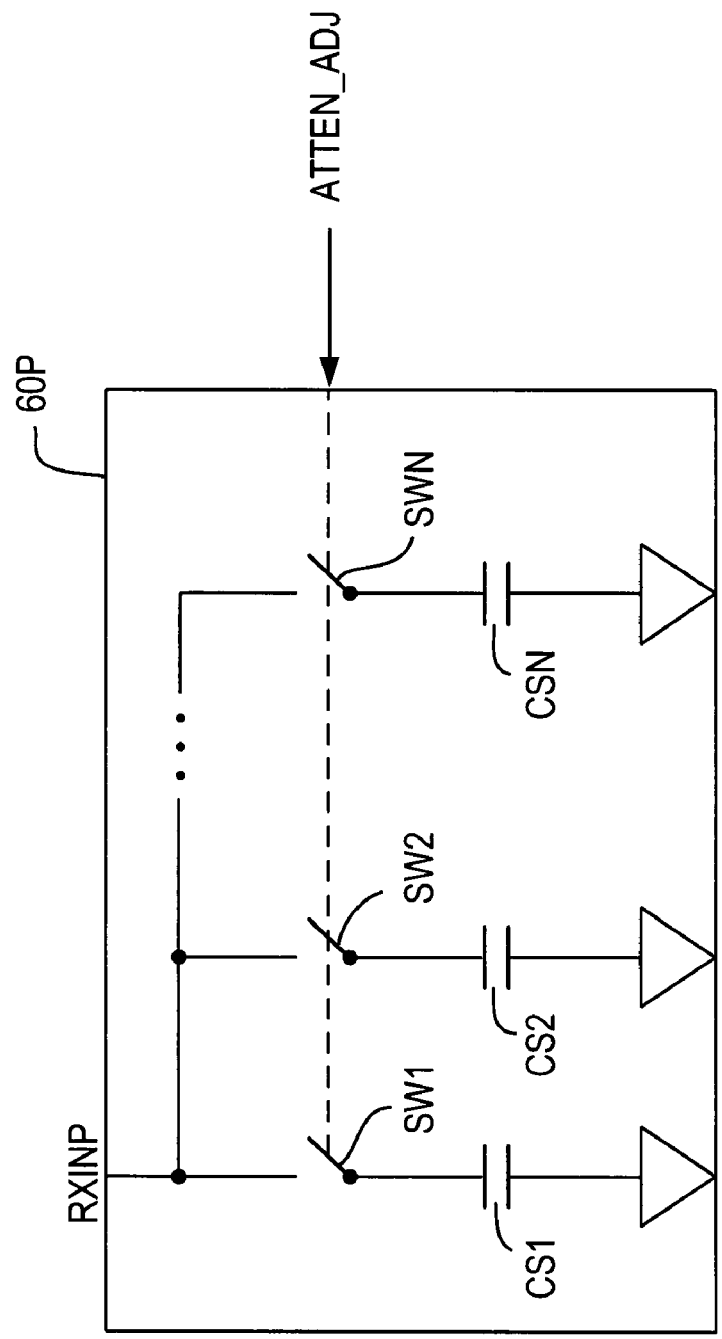
FIG. 2 is a simplified schematic block diagram of an illustrative implementation of a representative component in the FIG. 1 circuitry in accordance with the invention.

Also connected to node RXINP is variable attenuation circuit 60P. Also connected to node RXINN is variable attenuation circuit 60N. An illustrative construction of representative variable attenuation circuit 60P is shown in FIG. 2. In this illustrative embodiment, circuit 60P includes a plurality of capacitors CS1 through CSn. Each of these capacitors is connected in series with a respective one of switches SW1 through SWn. Each subcircuit that includes a switch SW and a capacitor CS is connected between node RXINP and ground. In other words, all of the SW/CS subcircuits are connected in parallel with one another between node RXINP and ground. Each of switches SW can be individually turned on (closed position) or off (open position) by control signals that are labeled Atten_adj in FIGS. 1 and 2. The general kind and origin of the Atten_adj control signals can be similar to the kind and origin of the control signals for switches S1P, S1N, S2P, and S2N, as well as the BW_Ctrl control signals. The amount of capacitance that each of attenuation circuits 60P and 60N couples to the associated node RXINP or RXINN is determined by how many of switches SW are closed (and also, of course, by the magnitude of the capacitance CS connected to each switch SW that is closed). In particular, the amount of capacitance coupled to a node RXINP or RXINN is the sum of the capacitances of the capacitors CS to which closed switches SW are connected. The capacitive value of each of circuits 60 is therefore controlled by which and/or how many of switches SW are closed.

Nodes RXINP and RXINN are connected to the differential input terminals of RX driver 70. Driver 70 drives the received signal to further downstream circuitry, which may lead ultimately to PLD core 80. PLD core 80 typically includes the general-purpose, programmable, logic circuitry of the PLD. Core 80 is typically configured (programmed) to perform particular functions (e.g., logic functions) by programming the bits of CRAM 90, which is shown for convenience as part of PLD core 80. PLD core 80 (including CRAM 90) can be the source of the signals 100 for controlling switches S1P, S1N, S2P, S2N, and SW1-SWn, as well as the source for the BW_Ctrl signals. Any or all of these control signals 100 can be static or relatively static signals from CRAM 90. (Of course, the values of such CRAM signals can be changed by reprogramming CRAM 90 if PLD 10 is of a reprogrammable kind.) Alternatively, any or all of control signals 100 can be more dynamic signals from operating (e.g., logic or memory) circuitry of core 80. By "dynamic" it is meant that these signals can change from time to time during the course of normal, post-configuration operation of the PLD. Changing a CRAM 90 output signal requires reprogramming the device. Changing a dynamic output signal of PLD core 80 does not require reprogramming the device. Rather, a dynamic output signal can change, for example, as a result of some logical operation that is being performed by the core logic circuitry 80 of the device.

Continuing now with a discussion of the various kinds of operations that are possible with circuitry of the kind that is illustrated by FIG. 1, control signals 100 can be used to control the following: (1) ability to enable AC coupling via capacitors C1P/C1N by opening switches S1P/S1N, or alternatively to bypass such AC coupling by closing those switches; (2) ability to select an attenuation factor of selectable magnitude using attenuation circuits 60P/60N as controlled by the Atten_adj signals; and (3) ability to select the corner frequency (or cut-off frequency) of a low-pass filter function applied to the input signal. This last type of operation is selected by closing switches S2P/S2N and giving resistors R1P/R1N a desired amount of resistance using the BW_Ctrl control signals.

The above-described operating modes may be needed if, for example, TX driver 20 drives a differential signal having an amplitude that is too large (e.g., for RX driver 70 without the benefit of the present invention), or that has a common mode voltage that is too high (again, e.g., for RX driver 70 without the benefit of this invention). The invention can enable AC coupling capacitors C1P/C1N (by opening switches S1P/S1N) and additionally use internal resistors R1P/R1N and CM driver 50 (by closing switches S2P/S2N and controlling resistances R1P/R1N) to set the optimal common mode voltage. Thus, for AC coupling, switches S1P/S1N are open and switches S2P/S2N are closed. In addition, resistors R1P/R1N are controllable (via control signals BW_Ctrl), which allows controllable selection of the corner frequency of the low-pass, RC filter function. For example, each of resistors R1P and R1N can be a bank of resistors having different values. Each resistor can be selected or deselected by turning on or off a switch in series with that resistor. In such an illustrative implementation the BW_Ctrl signals are used to turn on or off these resistor-selecting switches. By selecting different ones of these resistors, the low-pass filter corner frequency can be changed.

Capacitor C1P/C1N along with attenuation circuits 60P/60N allow the user of PLD 10 to choose an attenuation factor. An example calculation for representative node RXINP is as follows:

$VRXINP = VRXP * C1P/(C1P + Csel),$ where Csel is the value of capacitance chosen using the bank of capacitors CS1-CSn in FIG. 2. For example, if Csel is chosen to be equivalent to C1P, then the attenuation factor is 0.5. (VRXINP means voltage at node RXINP. VRXP means voltage at node RXP.)

The use of on-chip AC coupling capacitors can save valuable circuit board real estate (i.e., space or area), and is desired by users of PLDs because it reduces component counts. The use of on-chip AC coupling capacitors does, however, require data to be DC balanced (e.g., via encoding such as 8-bit/10-bit ("8B10B") encoding). This approach is easily employed for clock signals, which tend to have a balanced pattern of information (i.e., signal alternately high and low for equal periods of time).

Additionally, attenuation adjustment as described above allows interfacing with signal swings that might violate over-stress conditions. This is a situation that can arise as PLDs migrate to lower voltage oxides due to integrated circuit feature-size reductions.

Although the illustrative embodiment described for the most part above involves the handling of a differential input signal, it has been mentioned that this invention is equally applicable to handling a single-ended input signal. Illustrative circuitry for handling such a single-ended signal in accordance with the invention may basically include either the upper half or the lower half of the circuitry shown in FIG. 1. A somewhat more generic description of node 40 (whether in a differential embodiment as in FIG. 1 or in a single-ended embodiment) is as a reference voltage source.

The portion of PLD core 80 other than CRAM 90 may be referred to as operational logic circuitry. Such operational logic circuitry may include such things as general-purpose programmable logic, blocks of dynamic memory, microprocessor blocks, DSP blocks, etc. This is among the circuitry of PLD 10 that is used for what may be termed normal or normal mode operation of the device (typically after the device has been configured by programming CRAM 90 during what may be referred to as configuration mode operation of the device). The operational logic circuitry of the device can be the source of "dynamic" control signals 100 as described earlier in this specification. Alternatively, CRAM 90 can be the source of "programmable" control signals 100. If desired, some of control signals 100 may be dynamic, while others of control signals 100 may be programmable.

It will be understood that the foregoing is only illustrative of the principles of the invention, and that various modifications can be made by those skilled in the art without departing from the scope and spirit of the invention. It will be further understood that the switches shown and described above are typically transistor switches.

What is claimed is:

1. A programmable logic device comprising:
   an input signal node;
   input signal buffer circuitry;
   a circuit path connected between the input signal node and the input signal buffer circuitry;
   selectively usable AC coupling circuitry connected in the circuit path;
   a selectively usable resistance connection between the circuit path and a reference voltage source; and
   a selectively usable attenuation circuit connected to the circuit path.

2. The device defined in claim 1 further comprising:
   a source of a control signal for use in controlling whether or not at least one of the AC coupling circuitry, the resistance connection, and the attenuation circuit is used.

3. The device defined in claim 2 wherein
   the source of a control signal comprises:
   programmable circuitry whereby the control signal can be programmably determined.

4. The device defined in claim 2 wherein
   the source of a control signal comprises:
   operational logic circuitry.

5. The device defined in claim 1 wherein the AC coupling circuitry comprises a capacitor connected in parallel with a selectively closable switch.

6. The device defined in claim 1 wherein the resistance connection has controllably variable resistance.

7. The device defined in claim 6 further comprising:
   a source of a control signal for use in controlling the resistance of the resistance connection.

8. The device defined in claim 1 wherein the resistance connection comprises a resistor connected in series with a selectively closable switch.

9. The device defined in claim 1 wherein the attenuation circuit has controllably variable attenuation.

10. The device defined in claim 9 further comprising:
    a source of a control signal for use in controlling the attenuation of the attenuation circuit.

11. The device defined in claim 1 wherein the attenuation circuit comprises a capacitor connected in series with a selectively closable switch.

12. A programmable logic device comprising:
    first and second input nodes for receiving a differential input signal;
    differential input signal buffer circuitry having first and second input terminals;
    first and second circuit paths connected, respectively, between the first and second input nodes and the first and second input terminals;
    selectively usable AC coupling circuitry connected in each of the circuit paths;
    a selectively usable resistance connection between each of the circuit paths and a reference voltage source; and
    a selectively usable attenuation circuit connected to each of the circuit paths.

13. The device defined in claim 12 wherein the reference voltage source comprises:
    common mode driver circuitry.

14. The device defined in claim 12 further comprising:
    a source of control signals for controlling whether or not each of the AC coupling circuitries, the resistance connections, and the attenuation circuits are used.

15. The device defined in claim 14 wherein the source of control signals comprises:
    programmable circuitry whereby a least one of the control signals can be programmably determined.

16. The device defined in claim 14 wherein the source of control signals comprises:
    operational logic circuitry whereby at least one of the control signals can be dynamically determined.

17. The device defined in claim 12 wherein each of the resistance connections has controllably variable resistance.

18. The device defined in claim 17 further comprising:
    a source of control signals for use in controlling the resistance of the resistance connections.

19. The device defined in claim 12 wherein each of the attenuation circuits has controllably variable attenuation.

20. The device defined in claim 19 further comprising:
    a source of control signals for use in controlling the attenuation of the attenuation circuits.

21. A programmable logic device comprising:
    a differential input signal termination;
    selectively usable AC coupling circuitry for outputting the differential input signal from the termination;
    selectively usable differential resistive connections of outputs of the AC coupling circuitry to a reference voltage source;
    selectively usable attenuation circuits connected to the outputs of the AC coupling circuitry; and
    differential driver circuitry having
    differential inputs that are connected to the outputs of the AC coupling circuitry.

22. The device defined in claim 21 wherein the reference voltage source comprises:
    common mode driver circuitry.

* * * * *